(12) United States Patent
Kuo et al.

(10) Patent No.: US 9,472,638 B2
(45) Date of Patent: Oct. 18, 2016

(54) FINFETS WITH MULTIPLE THRESHOLD VOLTAGES

(71) Applicant: Taiwan Semiconductor Manufacturing Company, Ltd., Hsin-Chu (TW)

(72) Inventors: Po-Chin Kuo, Hsin-Chu (TW); Hsien-Ming Lee, Changhua (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/825,665

(22) Filed: Aug. 13, 2015

(65) Prior Publication Data

US 2015/0349080 A1 Dec. 3, 2015

Related U.S. Application Data

(60) Continuation of application No. 14/481,243, filed on Sep. 9, 2014, now Pat. No. 9,123,746, which is a division of application No. 13/328,936, filed on Dec. 16, 2011, now Pat. No. 8,907,431.

(51) Int. Cl.
*H01L 29/78* (2006.01)
*H01L 29/49* (2006.01)
*H01L 29/423* (2006.01)
*H01L 29/66* (2006.01)
(Continued)

(52) U.S. Cl.
CPC ..... *H01L 29/4983* (2013.01); *H01L 21/28105* (2013.01); *H01L 21/28114* (2013.01); *H01L 21/30604* (2013.01); *H01L 29/4238* (2013.01); *H01L 29/42376* (2013.01); *H01L 29/4966* (2013.01); *H01L 29/6681* (2013.01); *H01L 29/66795* (2013.01); *H01L 29/785* (2013.01); *H01L 29/7851* (2013.01)

(58) Field of Classification Search
CPC ................ H01L 29/785; H01L 29/4958
USPC ........ 257/250, 347, 365, 366, 407; 438/197, 438/283, 284
See application file for complete search history.

(56) References Cited

U.S. PATENT DOCUMENTS 6,855,989 B1 2/2005 Wang et al.
7,659,157 B2 * 2/2010 Greene .......... H01L 21/823807
257/E21.242
(Continued)

FOREIGN PATENT DOCUMENTS

KR 100620065 9/2006

OTHER PUBLICATIONS

Jurczak, M, et al., "Review of FINFET Technology," 2009, IEEE, 4 pgs.

*Primary Examiner* — Allen Parker
*Assistant Examiner* — Stephen Bradley
(74) *Attorney, Agent, or Firm* — Slater Matsil, LLP

(57) ABSTRACT

A device includes a substrate, a semiconductor fin over the substrate, and a gate dielectric layer on a top surface and sidewalls of the semiconductor fin. A gate electrode is spaced apart from the semiconductor fin by the gate dielectric layer. The gate electrode includes a top portion over and aligned to the semiconductor fin, and a sidewall portion on a sidewall portion of the dielectric layer. The top portion of the gate electrode has a first work function, and the sidewall portion of the gate electrode has a second work function different from the first work function.

21 Claims, 14 Drawing Sheets

(51) Int. Cl.
  *H01L 21/28* (2006.01)
  *H01L 21/306* (2006.01)

(56) References Cited

U.S. PATENT DOCUMENTS

| | | |
|---|---|---|
| 7,781,810 B1 | 8/2010 | An et al. |
| 8,237,233 B2 | 8/2012 | Anderson et al. |
| 2004/0222466 A1 | 11/2004 | Fried et al. |
| 2006/0113605 A1* | 6/2006 | Currie ............ H01L 21/823807 257/368 |
| 2007/0063224 A1 | 3/2007 | Watanabe et al. |
| 2010/0109095 A1* | 5/2010 | Li .................... H01L 21/28229 257/392 |
| 2010/0317181 A1* | 12/2010 | Chung ........... H01L 21/823821 438/585 |
| 2011/0163393 A1 | 7/2011 | Lander |
| 2011/0316081 A1 | 12/2011 | Chan et al. |
| 2013/0127058 A1 | 5/2013 | Lavoie et al. |
| 2013/0154098 A1 | 6/2013 | Lavoie et al. |

* cited by examiner

US 9,472,638 B2

FINFETS WITH MULTIPLE THRESHOLD VOLTAGES

PRIORITY CLAIM AND CROSS-REFERENCE

This application is a continuation of U.S. patent application Ser. No. 14/481,243, entitled "FinFETs with Multiple Threshold Voltages," filed on Sep. 9, 2014, which application is a divisional of U.S. patent application Ser. No. 13/328,936, entitled "FinFETs with Multiple Threshold Voltages," filed on Dec. 16, 2011, now U.S. Pat. No. 8,907,431, which applications are incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFET) were thus developed. Compared to planar devices, The FinFET transistors have better short channel effect (SCE) that enable their continuous scaling, and higher driving currents due to the increased channel widths. The increase in the channel widths of FinFETs is achieved by forming channels that include portions on the sidewalls of the fins and portions on the top surfaces of the fins. A FinFET may be a double-gate FET, which includes channels on the sidewalls of the respective fin, but no channel on the top surface of the respective fin. A FinFET may also be a triple-gate FET, which includes channels on the sidewalls and the top surface of the respective fin. Since the drive currents of transistors are proportional to the channel widths, the drive currents of the FinFETs are increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Fin Field-Effect Transistor (FinFET) and the methods of forming the same are provided in accordance with various embodiments. The intermediate stages of forming the FinFET are illustrated. The variations and the operation of the FinFET in accordance with embodiments are discussed. Throughout the various views and illustrative embodiments, like reference numbers are used to designate like elements.

Figure 1A:
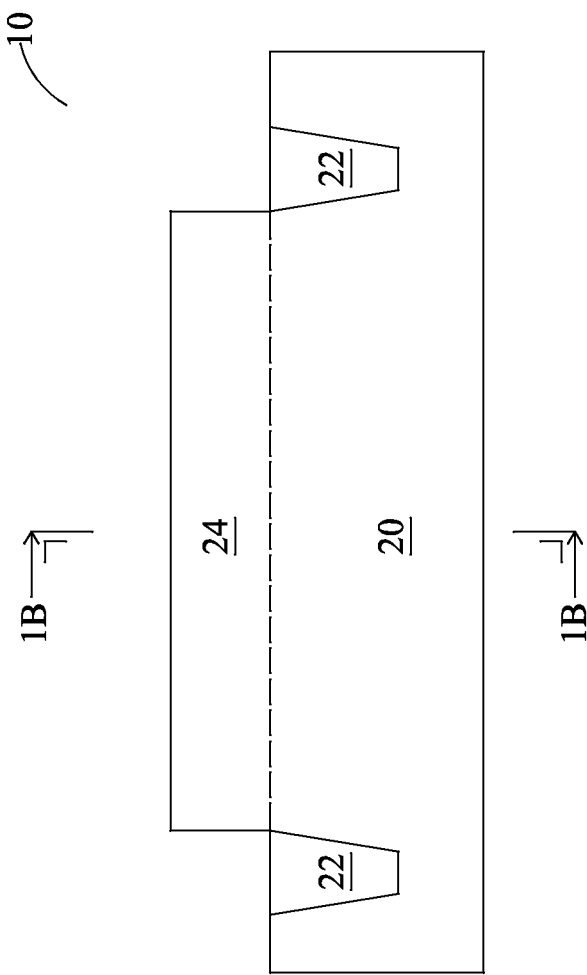
FIGS. 1A through 6B are cross-sectional views of intermediate stages in the manufacturing of a Fin Field-Effect Transistors (FinFET) in accordance with some exemplary embodiments, wherein a gate-first approach is adopted to form the FinFET.

FIGS. 1A through 6B are cross-sectional views of intermediate stages in the manufacturing of a Fin Field-Effect Transistors (FinFET) in accordance with some exemplary embodiments. Referring to FIGS. 1A and 1B, an initial structure is formed. The cross-sectional view shown in FIG. 1B is obtained from the plane crossing line 1B-1B in FIG. 1A. The initial structure includes a part of wafer 10, which further includes substrate 20. Substrate 20 may be a semiconductor substrate, which may further be a silicon substrate, a germanium substrate, or a substrate formed of other semiconductor materials. Substrate 20 may be doped with a p-type or an n-type impurity. Isolation regions such as Shallow Trench Isolation (STI) regions 22 may be formed in substrate 20. Semiconductor fin 24 is formed over STI regions 22. In some embodiments, semiconductor fin 24 comprises same materials as substrate 20, and may be formed from semiconductor substrate 20, for example, by recessing STI regions 22.

Figure 2:
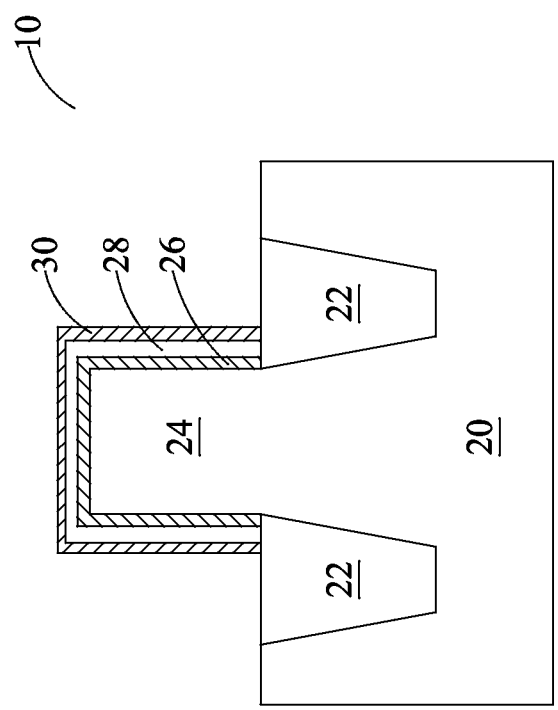

Referring to FIG. 2, interfacial layer 26 is formed on fin 24. Interfacial layer 26 may be formed of a chemical oxide, a thermal oxide, or the like. In some embodiments, interfacial layer 26 may be formed by oxidizing a surface layer of fin 24. Gate dielectric layer 28 is formed on interfacial layer 26. In accordance with some embodiments, gate dielectric layer 28 comprises silicon oxide, silicon nitride, or multi-layers thereof. In alternative embodiments, gate dielectric layer 28 is formed of a high-k dielectric material, and hence is alternatively referred to as high-k dielectric layer 28 throughout the description. High-k dielectric layer 28 may have a k value greater than about 7.0, and may include an oxide or a silicate of Hf, Al, Zr, La, Mg, Ba, Ti, Pb, and combinations thereof. Exemplary materials of high-k dielectric layer 28 include $MgO_x$, $BaTi_xO_y$, $BaSr_xTi_yO_z$, $PbTi_xO_y$, $PbZr_xTi_yO_z$, and the like, with values X, Y, and Z being between 0 and 1. The thickness of high-k dielectric layer 28 may be between about 1 nm and about 10 nm. One of ordinary skill in the art will realize, however, that the dimensions recited throughout the specification are examples, and may be changed to different values. The formation methods of gate dielectric layer 28 may include Molecular-Beam Deposition (MBD), Atomic Layer Deposition (ALD), Physical Vapor Deposition (PVD), and the like.

Over gate dielectric layer 28, capping layer 30 may be formed. In alternative embodiments, capping layer 30 is not formed, and the subsequently formed metal layers 34 and 40 (not shown in FIG. 2, please refer to FIGS. 3A through 4) are formed directly on, and may be in contact with, gate dielectric layer 28. In some embodiments, capping layer 30 has a mid-gap work function, which may be close to the mid-level of the conduction and valence bands of silicon. In some exemplary embodiments, capping layer 30 comprises titanium nitride (TiN). In alternative embodiments, the exemplary materials of capping layer 30 include titanium-containing materials and/or titanium-containing materials such as TaC, TaN, TaAlN, TaSiN, and combinations thereof.

Figure 3A:
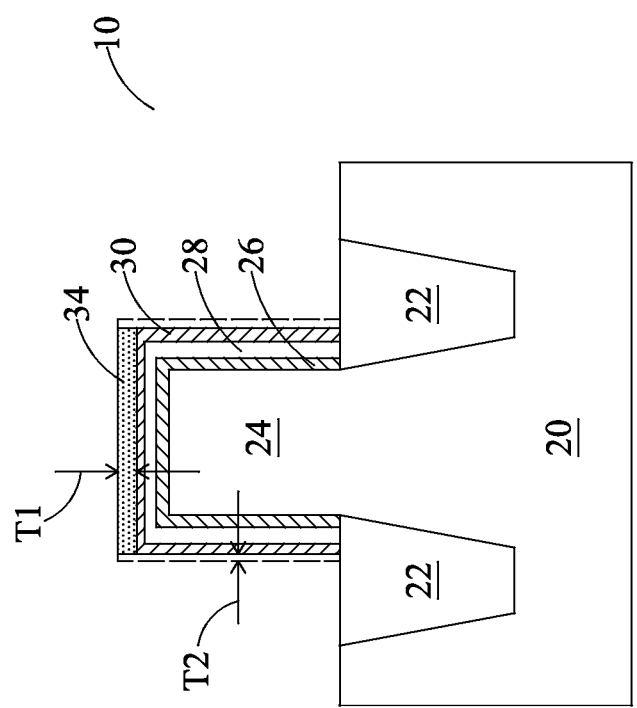

Referring to FIG. 3A, non-conformal metal layer 34 is formed over and aligned to fin 24. In some embodiments, metal layer 34 is formed using a non-conformal deposition method such as PVD. As a result, non-conformal metal layer 34 comprises a top portion over and aligned to fin 24, and does not comprise portions on the sidewall portions of capping layer 30. In alternative embodiments, there may be a thin layer of metal layer 34 formed on the sidewall portions of capping layer 30, as illustrated using dashed lines. In accordance with these embodiments, thickness T2 of the sidewall portions (if any) of metal layer 34 is significantly smaller than thickness T1 of the top portion of metal layer 34. The ratio T2/T1 may be smaller than about 0.2, or smaller than about 0.1 in some exemplary embodiments. When non-conformal metal layer 34 includes a thin layer on the sidewall portions of capping layer 30, an etching step may be performed to etch and remove the sidewall portion of metal layer 34. During the etching, there may be no etching mask formed to cover the top portion of metal layer 34. In alternative embodiments, the etching step is not performed, and the thin metal layer 34 is left on the sidewall portions of capping layer 30. The thickness of the top portion of capping layer 30 may also be reduced in the etching step. Since thickness T1 is greater than thickness T2, after the etching, metal layer 34 still remains over and aligned to fin 24, while no sidewall portions of metal layer 34 remains. In some embodiments, thickness T1 is greater than about 10 Å, and may be between about 100 Å, so that the work function of metal layer 34 may affect the threshold voltage of the resulting FinFET.

Figure 3B:
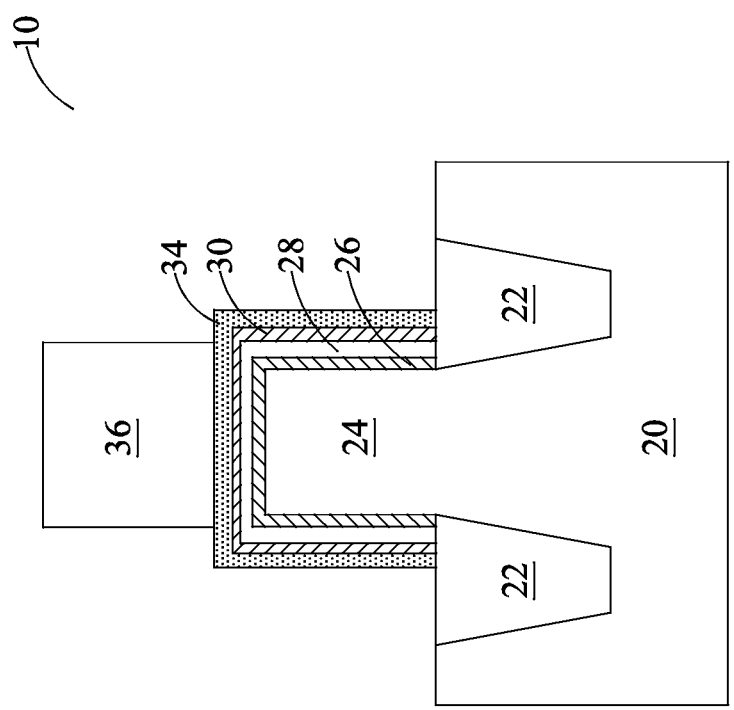

FIG. 3B illustrates the formation of metal layer 34 in accordance with alternative exemplary embodiments. In these embodiments, metal layer 34 may be initially formed using a conformal deposition method such as ALD or a Chemical Vapor Deposition (CVD) method. After the formation of metal layer 34, mask 36 is formed and patterned to cover the top portion of metal layer 34, and sidewall portions of metal layer 34 are not covered by mask 36. Mask 36 may comprise a photo resist or a hard mask such as silicon nitride. The exposed sidewall portions of metal layer 34 are then removed in an etching step, and the top portion of metal layer 34 is left un-etched. After the etching step, mask 36 is removed.

Figure 4:
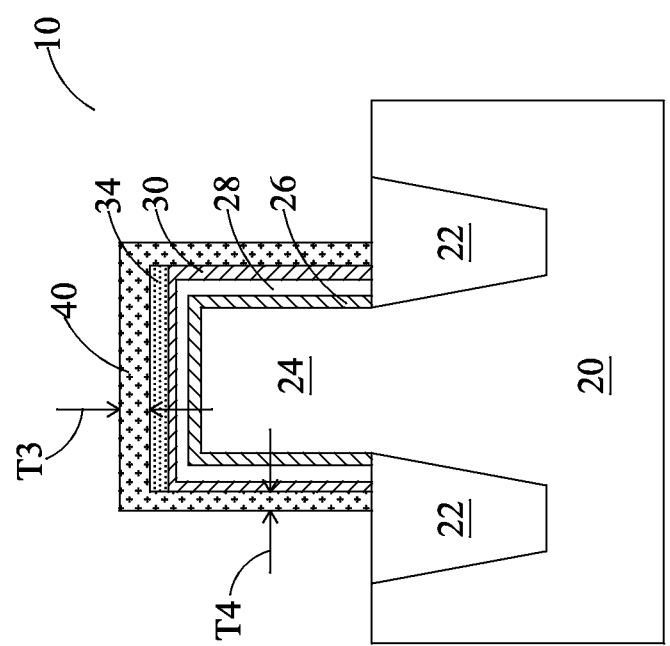

Referring to FIG. 4, metal layer 40 is formed. Metal layer 40 includes a portion on the top of metal layer 34. Furthermore, metal layer extends on the sidewall portions of capping layer 30. In some embodiments, metal layer 40 is a conformal layer, wherein top thickness T3 and sidewall thickness T4 are close to other. In some exemplary embodiments, the difference between thicknesses T3 and T4 may be smaller than about 20 percent, or smaller than about 10 percent, of both thicknesses T3 and T4. Thicknesses T3 and T4 may be greater than about 10 Å, and may be between about 10 Å and about 100 Å in some embodiments.

Metal layers 34 and 40 comprise different materials, and may have different work functions. Work function WF34 of metal layer 34 may be greater than or smaller than work function WF40 of metal layer 40. In some embodiments, work functions WF34 and WF40 may have a difference greater than about 0.1 eV, or between about 0.1 eV and about 1.0 eV, although the difference may be greater or smaller. In the embodiments wherein the resulting FinFET 60 (FIG. 6A) is a P-type FinFET, each of work functions WF34 and WF40 may be between about 4.1 eV and about 5.2 eV. In the embodiments wherein the resulting FinFET 60 (FIG. 6A) is an N-type FinFET, each of work functions WF34 and WF40 may be between about 4.1 eV and about 5.2 eV. In some embodiments, the materials of metal layers 34 and 40 may be selected from TiN, TaN, TaAlC, TiAl, TaC, TaAl, Co, and combinations thereof.

Figure 5A:
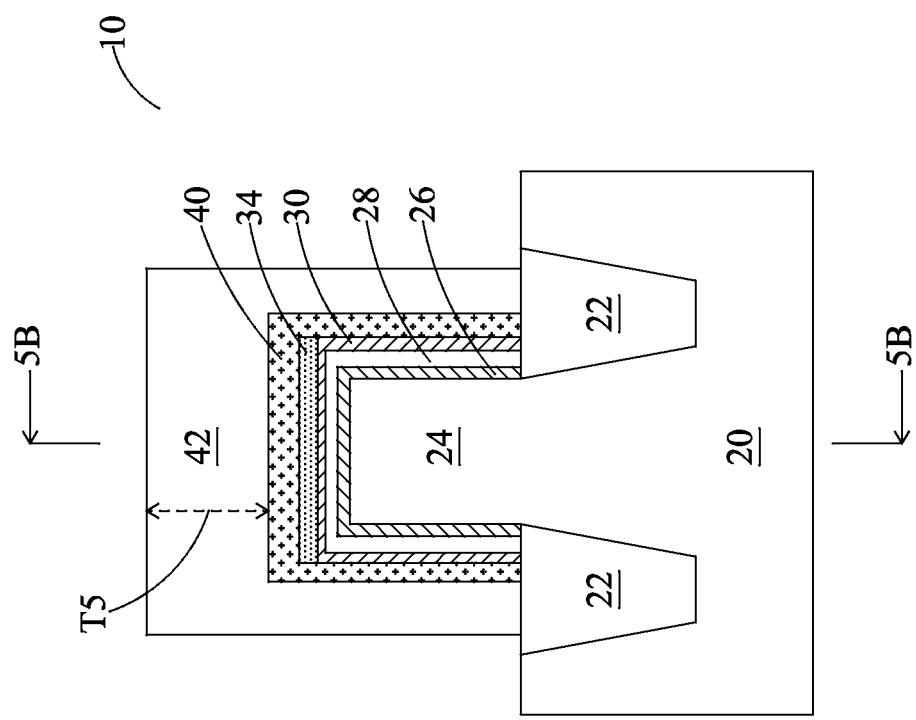
Figure 5B:
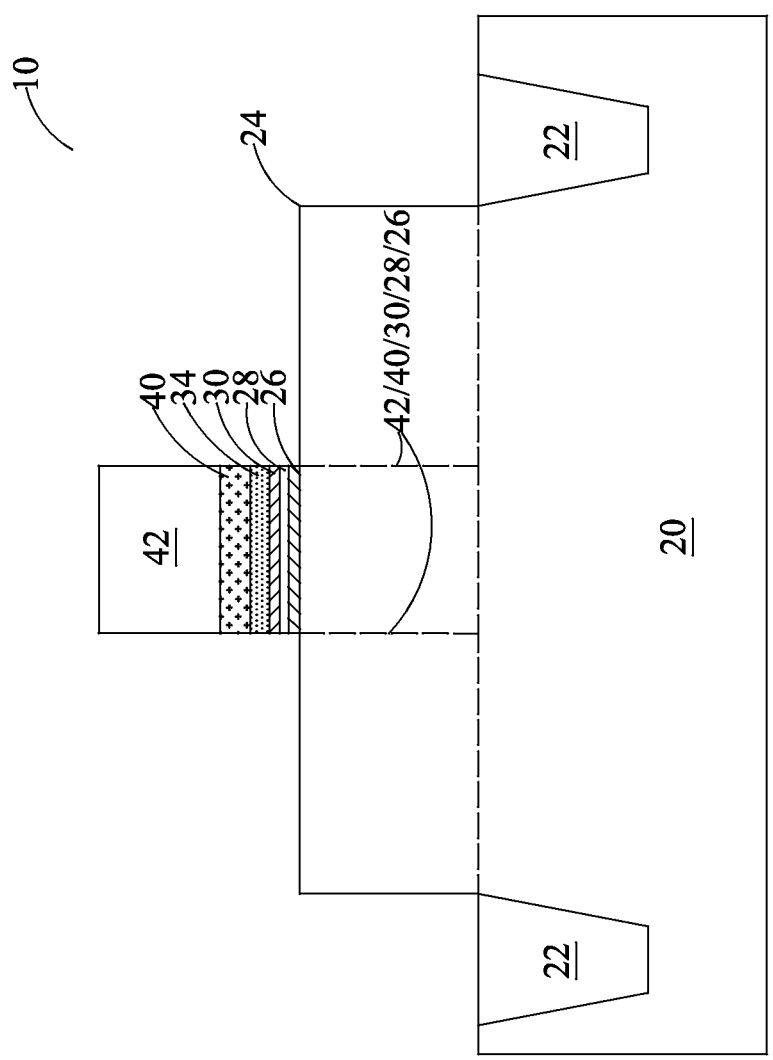

Referring to FIGS. 5A and 5B, thick metal layer 42 is formed. In some embodiments, thick metal layer 42 is formed of aluminum or an aluminum alloy. Thickness T5 of thick metal layer 42 may be greater than about 50 nm, and may be between about 50 nm and about 120 nm, for example. After the formation of thick metal layer 42, metal layers 42, 40, and 34, capping layer 30, dielectric layer 28, and interfacial layer 26 are patterned to form a gate stack, wherein the gate stack may be viewed from FIG. 5B. The Cross-sectional view in FIG. 5B is obtained from the plane crossing line 5B-5B in FIG. 5A. As illustrated in FIG. 5B, metal layer 34 is formed on the top of a middle section of fin 24. Furthermore, metal layer 34 is over the top surface of semiconductor fin 24, and substantially no portion of metal layer 34 extends to below the top surface of semiconductor fin 24. Metal layers 40 and 42, capping layer 30, dielectric layer 28, and interfacial layer 26 also extend on the top surface and sidewalls of fin 24.

Figure 6A:
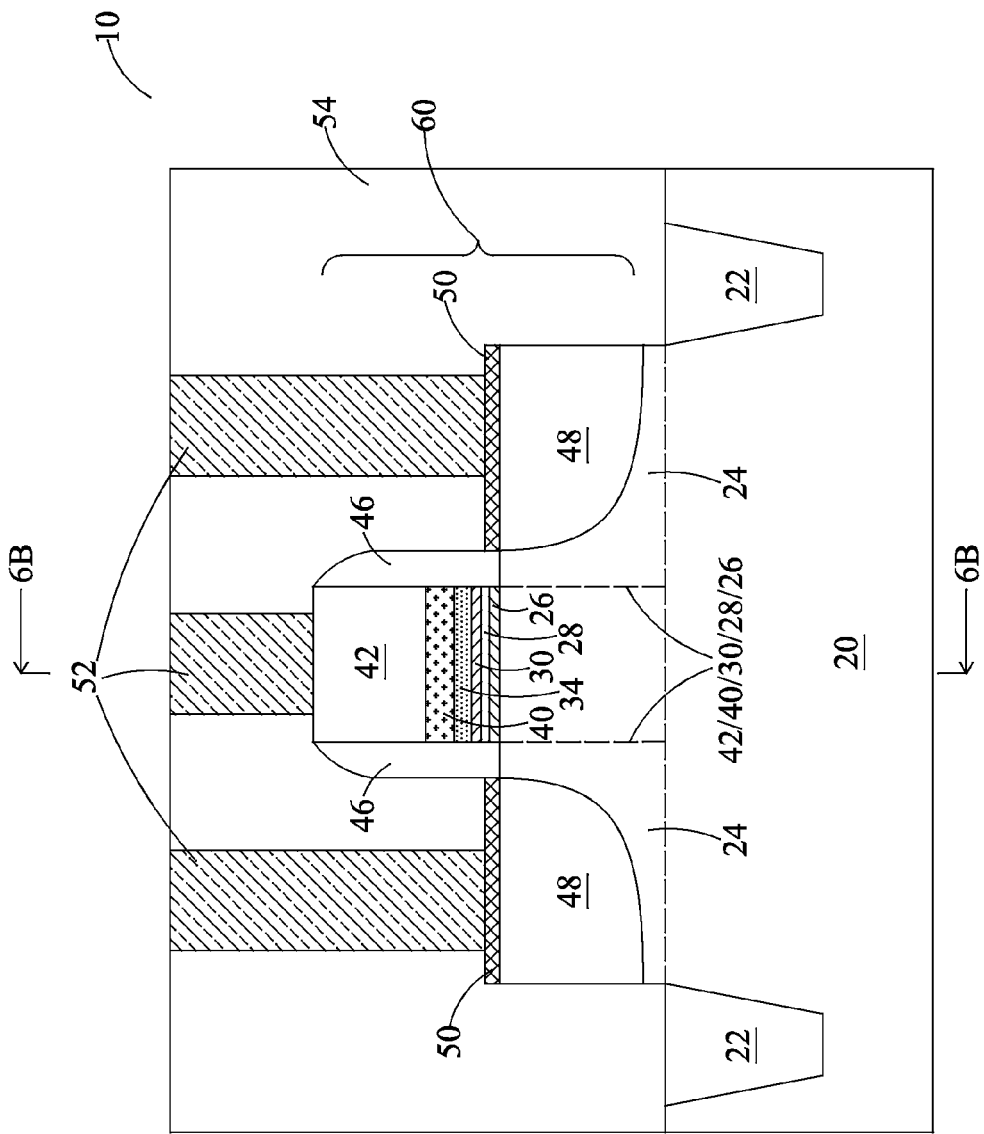
Figure 6B:
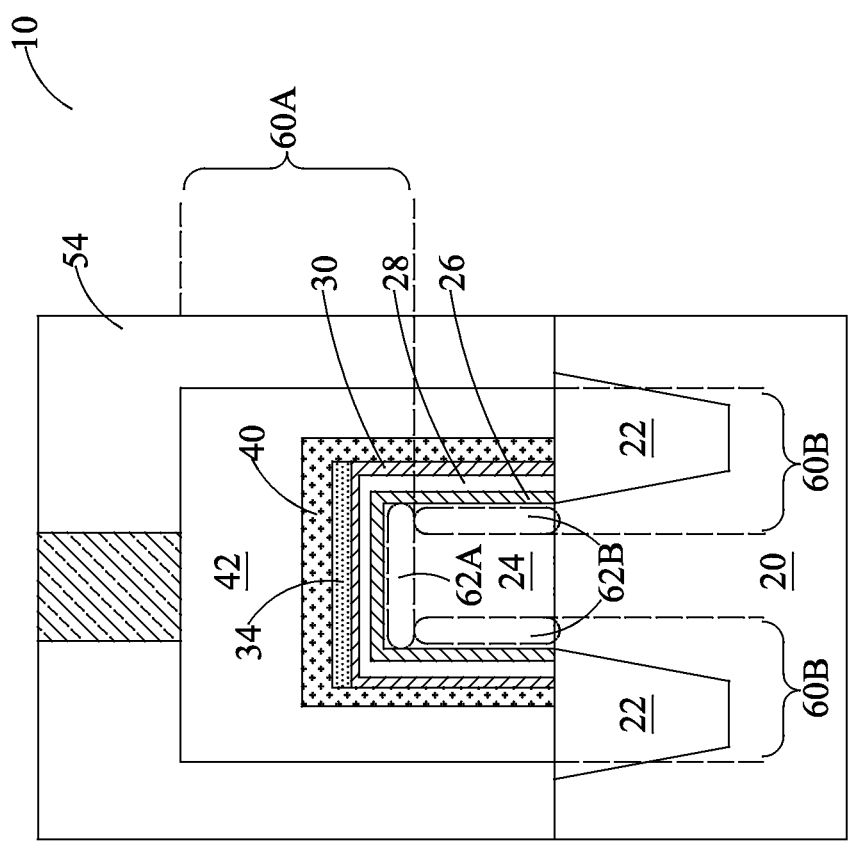

FIGS. 6A and 6B illustrate the formation of gate spacers 46, source and drain regions 48, source/drain silicide regions 50, contact plugs 52, and Inter-Layer Dielectric (ILD) 54. The formation of FinFET 60 is thus finished. Referring to FIG. 6A, in some embodiments, gate spacers 46 are first formed on the sidewalls of interfacial layer 26, dielectric layer 28, capping layer 30, and metal layers 34, 40, and 42. Next, source and drain regions 48 are formed. In some embodiments, source and drain regions 48 are formed through deep implantations. Depending on the conductivity type of FinFET 60, an n-type impurity may be implanted to form an n-type FinFET 60, or a p-type impurity may be implanted to form a p-type FinFET 60. The doping concentration of deep source/drain regions 48 may be between about $1\times10^{20}/cm^3$ and about $1\times10^{21}/cm^3$ or higher. In some embodiments, the formation of source and drain regions 48 may also comprise etching portions of fin 24 that are not covered by metal layers 34, 40, and 42, and performing an epitaxy to grow stressors (not shown, which may be silicon germanium or silicon carbon). The stressors are then implanted to form source/drain regions 48.

FIG. 6A also illustrates the formation of silicide regions 50 (which may be germano-silicide regions). Silicide regions 50 may be formed by blanket depositing a thin layer of metal, such as nickel, titanium, cobalt, and combinations thereof. Wafer 10 is then heated, which causes silicon and germanium to react with the metal where contacted. After the reaction, a layer of metal silicide is formed between silicon (or silicon germanium) and the metal. The un-reacted metal is selectively removed through the use of an etchant that attacks the metal but does not attack silicide and germano-silicide. ILD 54 is then formed to cover FinFET 60, and contact plugs 52 are formed in ILD 54 to electrically couple to FinFET 60.

FIG. 6B illustrates a cross-sectional view of FinFET 60 as in FIG. 6A, wherein the cross-sectional view is obtained from the plane crossing line 6B-6B in FIG. 6A. Referring to FIG. 6B, the channel region 62 of FinFET 60 includes top portion 62A and sidewall portions 62B. Top channel portion 62A includes the top surface portion of fin 24, and sidewall channel portions 62B includes the sidewall portions of fin 24. Effectively, channel portion 62A and source and drain regions 48 form a first transistor 60A. The gate electrode of the first transistor 60A includes the top portions of layers 30, 34, 40 and 42 that are over and overlapping fin 24. Channel portions 62B and source and drain regions 48 form a second and a third transistor 60B. The gate electrodes of second transistors 60B include the sidewall portions of layers 30, 40, and 42 that are on the sidewalls of fin 24. It is appreciated that the gate electrodes of second transistors 60B may not include metal layer 34, or alternatively, include very thin metal layer 34.

The effective work function of the gate electrode of transistor 60A is affected by the work function of metal layer 34, which at least partially determines the threshold voltage VthA of transistor 60A. On the other hand, since metal layer 34 does not extend on the sidewalls of fin 24, the work functions of the gate electrodes of transistors 60B are not affected by the work function of metal layer 34. Instead, metal layer 40 has a great effect on the resulting work functions of the gate electrodes of transistors 60B. As a result, the effective work functions of the gate electrodes of transistors 60A and 60B may be different from each other. The effective work function of the gate electrode of transistor 60A may be higher than, equal to, or lower than, the effective work functions of the gate electrodes of transistors 60B. In some exemplary embodiments, the difference between the effective work functions of the gate electrodes of 60A and 60B may be greater than about 0.2 eV.

Regardless of whether FinFET 60 is p-type or n-type, as a result of the differences in work functions, threshold voltage VthA of transistor 60A and threshold voltages VthB of transistors 60B may be different from each other, although they may be equal to each other. In some embodiments, threshold voltage VthA is greater than threshold voltage VthB. In alternative embodiments, threshold voltage VthA is smaller than threshold voltage VthB. In some exemplary embodiments, the difference between threshold voltages VthA and VthB may be greater than about 0.2 V, and may be between about 0.2 V and about 1.0 V.

FIGS. 1A through 6B illustrate the gate-first approach for forming FinFET 60. FIGS. 7 through 10 illustrate cross-sectional views of intermediate stages in the formation of FinFET 60 in accordance with alternative embodiments, in which a gate-last approach may also be used to form FinFET 60. Unless specified otherwise, the materials and formation methods of the components in these embodiments are essentially the same as the like components, which are denoted by like reference numerals in the embodiment shown in FIGS. 1A through 6B. The formation details of the embodiment shown in FIGS. 7 through 10 may thus be found in the discussion of the embodiments shown in FIGS. 1A through 6B.

Figure 1B:
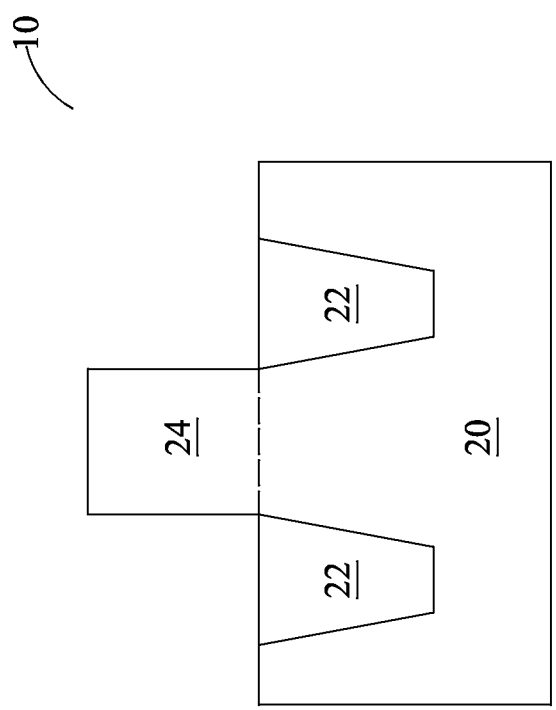
Figure 7:
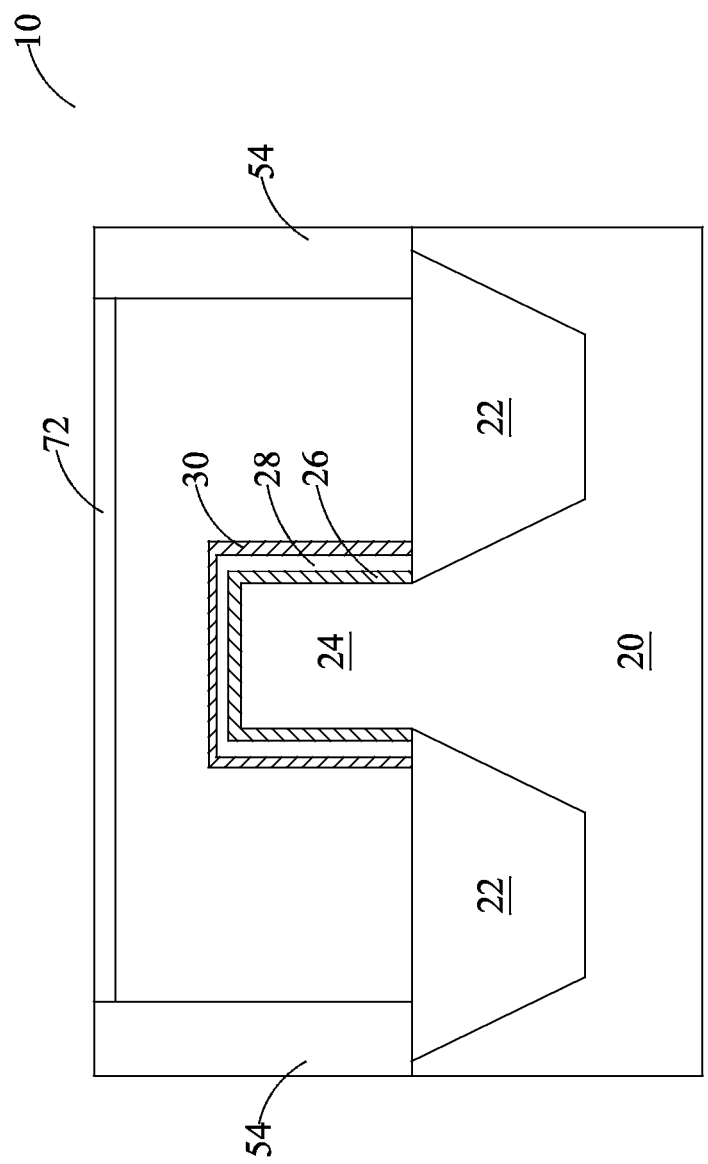
FIGS. 7 through 10 are cross-sectional views of intermediate stages in the manufacturing of a FinFET in accordance with some exemplary embodiments, wherein a gate-last approach is adopted to form the FinFET.

The initial steps of these embodiments may be essentially the same as shown in FIGS. 1A, 1B and 2. Next, as shown in FIG. 7, dummy gate 70 is formed. In some embodiments, dummy gate 70 comprises polysilicon, although other materials may be used. Hard mask 72, which may be formed of SiN, may be formed on dummy gate 70. Next, source/drain regions 48 and source/drain silicide regions 50 (not shown in FIG. 7, please refer to FIG. 6A) are formed. Since source/drain regions 48 and source/drain silicide regions 50 are not in the plane of FIG. 7, they are not illustrated. Source/drain regions 48 and source/drain silicide regions 50 may be essentially the same as shown in FIG. 6A.

Figure 8:
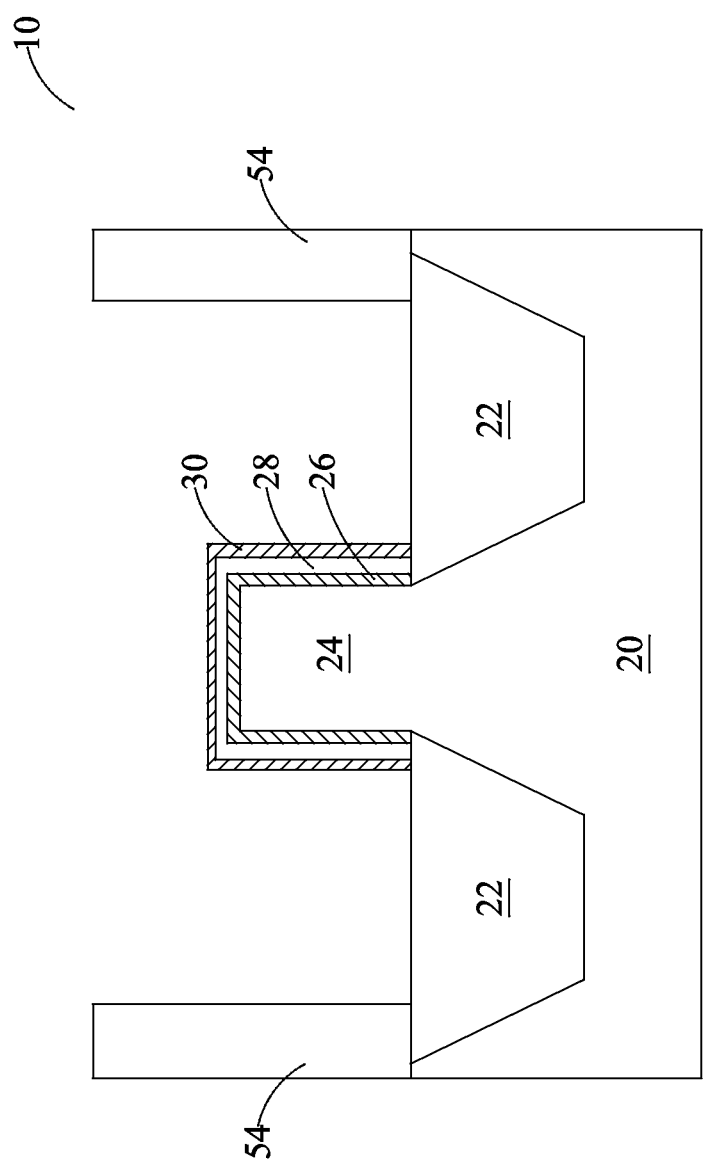
Figure 9:
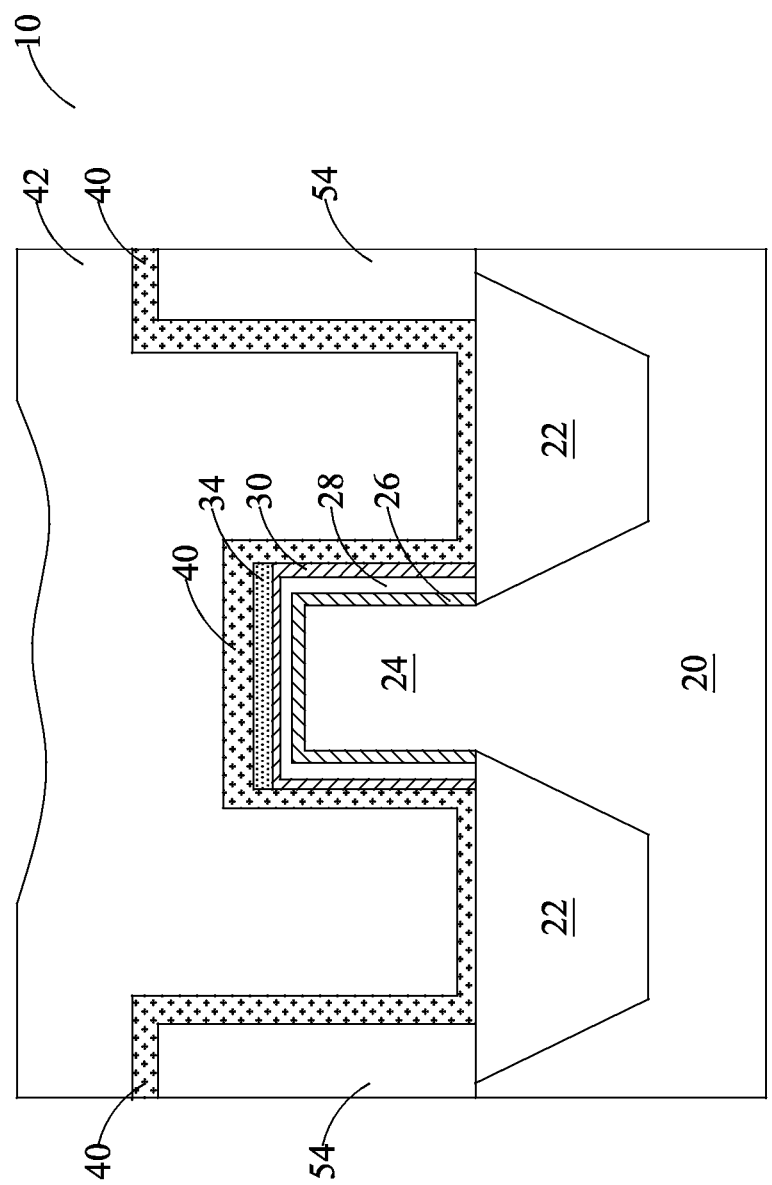
Figure 10:
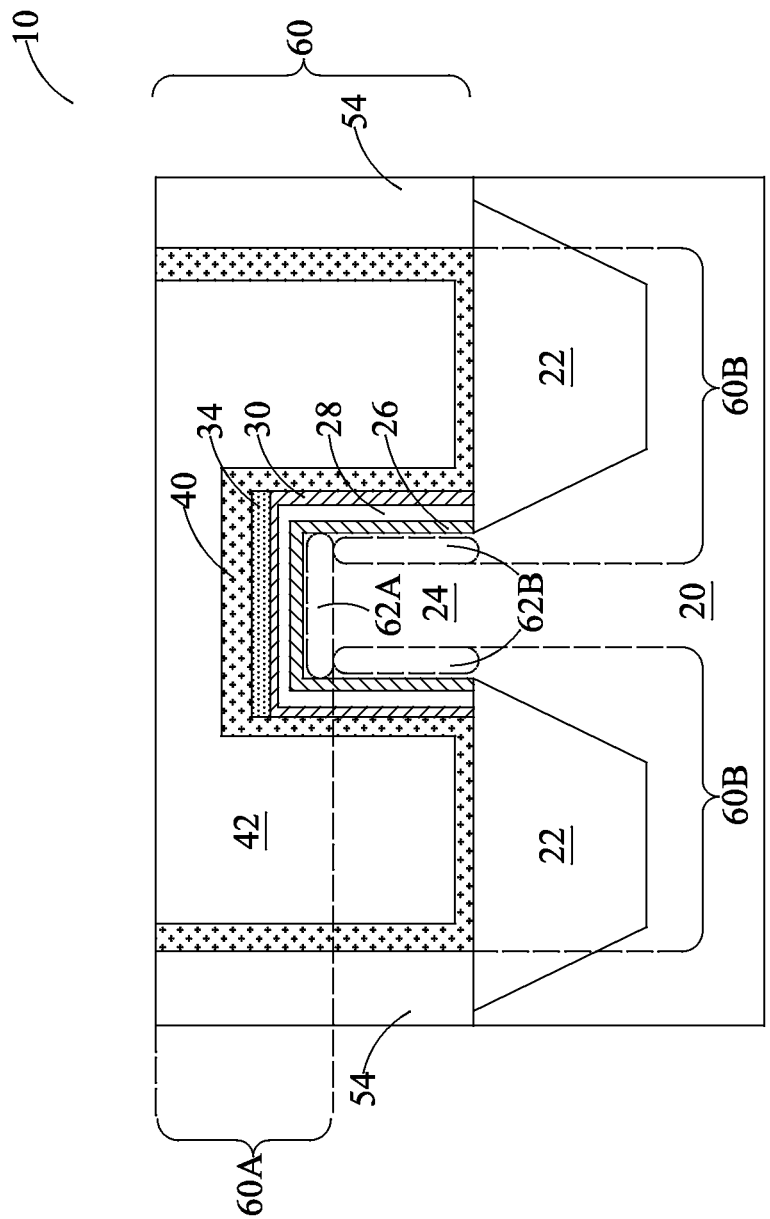

Next, ILD 54 is formed, followed by a Chemical Mechanical Polish (CMP). In the CMP, hard mask 72 may be used as a CMP stop layer, so that the top surface of ILD 54 may be level with the top surface of hard mask 72. Hard mask 72 and dummy gate 70 are then removed, and capping layer 30 is exposed. The resulting structure is shown in FIG. 8. In subsequent steps, as shown in FIG. 9, metal layers 34, 40, and 42 are formed. Similar to the embodiments in FIGS. 3A and 3B, metal layer 34 may be over and aligned to fin 24, and may not comprise sidewall portions on the sidewall portions of capping layer 30. Metal layer 40, however, comprises a portion over and aligned to metal layer 34, and portions extending to the sidewalls of capping layer 30. Metal layer 42 is then formed to fill the remaining space left by dummy gate 70. A CMP is then performed to remove excess portions of metal layers 40 and 42, so that the top surfaces of metal layers 40 and 42 are level with the top surface of ILD 54. Metal layers 34, 40, and 42 and capping layer 30 thus form the gate electrode of the resulting FinFET 60. The resulting FinFET 60 is shown in FIG. 10. In subsequent steps, an additional ILD (not shown) is formed over ILD 54, and contact plugs may be formed to penetrate through the additional ILD and ILD 54, and to electrically couple to the source/drain region and the gate electrode of FinFET 60.

In the embodiments shown in FIGS. 7 through 10, the gate of FinFET 60 is formed using the gate last approach. Gate dielectric layer 28, however, is formed before the replacement of the gate. The respective approach is thus sometimes referred to as a gate-last dielectric-first approach, or a gate-last HK-first approach if gate dielectric layer 28 is formed of a high-k dielectric material. In alternative embodiments, a gate-last dielectric-last approach (or gate-last HK-last approach) may be used. The process steps are similar to the steps shown in FIGS. 7 through 10, except that gate dielectric layer 28 is not formed before the formation of dummy gate 70. Rather, gate dielectric layer 28 is formed after the removal of dummy gate 70 (see the step shown in FIG. 8), and is formed before the formation of capping layer 30 as shown in FIG. 9. Accordingly, the resulting gate dielectric layer 28 also extends on the top surfaces of STI regions 22, and extends on the sidewalls of ILD 54.

In the embodiments, by forming top transistor 60A (FIGS. 6B and 10) to have a different threshold voltage than sidewall transistors 60B, the saturation current of the resulting FinFET 60 may be adjusted by adjusting the gate voltage of FinFET 60. For example, assuming threshold voltage VthA of top transistor 60A is greater than threshold voltage VthB of sidewall transistors 60B, if gate voltage Vg is smaller than threshold voltage VthB, none of transistors 60A and 60B are turned on, and the entire FinFET 60 is turned off. If gate voltage Vg is greater than threshold voltage VthB and smaller than threshold voltage VthA, sidewall transistors 60B are turned on, and top transistor 60A is turned off. The saturation current (referred to saturation current Isat1 hereinafter) of FinFET 60 is close to the total saturation currents of sidewall transistors 60B. If, however, gate voltage Vg is greater than threshold voltage VthA, transistors 60A and 60B are all turned on. The saturation current Isat2 of FinFET 60 is thus close to the total saturation currents of top transistor 60A and sidewall transistors 60B, which is greater than saturation current Isat1.

In accordance with embodiments, a device includes a substrate, a semiconductor fin over the substrate, and a gate dielectric layer on a top surface and sidewalls of the semiconductor fin. A gate electrode is spaced apart from the semiconductor fin by the gate dielectric layer. The gate electrode includes a top portion over and aligned to the semiconductor fin, and a sidewall portion on a sidewall portion of the dielectric layer. The top portion of the gate electrode has a first work function, and the sidewall portion of the gate electrode has a second work function different from the first work function.

In accordance with other embodiments, a device includes a substrate, and a semiconductor fin over the substrate, wherein the semiconductor fin is a part of a FinFET. A gate dielectric layer is disposed on a top surface and sidewalls of the semiconductor fin. A gate electrode is spaced apart from the semiconductor fin by the gate dielectric layer. The gate electrode includes a first metal layer over and aligned to the semiconductor fin, wherein the first metal layer does not comprise substantial portions that are lower than a top surface of the semiconductor fin. The gate electrode further includes a second metal layer comprising a first portion over and aligned to the first metal layer, and second portions lower than the top surface of the semiconductor fin. The first metal layer and the second metal layer comprise different materials. The first metal layer and the first portion of the second metal layer form a top portion of a gate electrode of the FinFET, and the second portions of the second metal layer form sidewall portions of the gate electrode of the FinFET.

In accordance with yet other embodiments, a method includes forming a gate dielectric on a semiconductor fin, wherein the gate dielectric comprises a top portion over a top surface of the semiconductor fin, and sidewall portions on sidewalls of the semiconductor fin. A first metal layer is formed over the first portion of the gate dielectric, wherein the first metal layer does not comprise portions extending on the sidewall portions of the gate dielectric. A second metal layer is formed, wherein the second metal layer comprises a first portion over the first metal layer, and second portions extending on the sidewall portions of the gate dielectric layer. The first and the second metal layers comprise different materials.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a substrate;
    a semiconductor fin over the substrate;
    a gate dielectric layer comprising a top portion overlapping the semiconductor fin, and a sidewall portion on a sidewall of the semiconductor fin; and
    a first metal layer contacting a top surface of the top portion of the gate dielectric layer, wherein the first metal layer does not extend to sides of the semiconductor fin; and
    a second metal layer contacting a sidewall of the sidewall portion of the gate dielectric layer, wherein the first metal layer and the second metal layer comprise different materials, and the second metal layer comprises a first portion over and aligned to the semiconductor fin, and second portions extending on the sides of the semiconductor fin.

2. The device of claim 1, wherein the first metal layer and the second metal layer have a first work function and a second work function, respectively, with the first work function different from the second work function.

3. The device of claim 2, wherein the first work function is higher than the second work function.

4. The device of claim 2, wherein the first work function is lower than the second work function.

5. The device of claim 2, wherein the first work function and the second work function have a difference greater than about 0.2 eV.

6. The device of claim 1, wherein the gate dielectric layer and the first metal layer form a top transistor with a top surface portion of the semiconductor fin, wherein the gate dielectric layer and the second metal layer form a sidewall transistor with a sidewall portion of the semiconductor fin, and wherein the top transistor has a first threshold voltage, and the sidewall transistor has a second threshold voltage different from the first threshold voltage.

7. A device comprising:
    a substrate;
    an Inter-Layer Dielectric (ILD) overlying the substrate, with an opening in the ILD;
    a semiconductor fin extending into the opening;
    a gate dielectric layer on a top surface and sidewalls of the semiconductor fin; and
    a gate electrode spaced apart from the semiconductor fin by the gate dielectric layer, wherein the gate electrode comprises:
        a first metal layer comprising a first top portion overlapping the semiconductor fin, and a first sidewall portion on a sidewall of the semiconductor fin;
        a second metal layer comprising a second top portion overlapping the first metal layer, and a second sidewall portion on a sidewall of the first metal layer; and
        a third metal layer between the first top portion and the second top portion, wherein the first metal layer and the third metal layer have different work functions.

8. The device of claim 7, wherein the third metal layer has a work function higher than a work function of the first metal layer.

9. The device of claim 7, wherein the third metal layer has a work function lower than a work function of the first metal layer.

10. The device of claim 7 further comprising a capping layer over the gate dielectric layer and under the first, the second, and the third metal layers, wherein the first metal layer and the third metal layer both contact the capping layer.

11. The device of claim 10, wherein the capping layer comprises titanium nitride or tantalum nitride.

12. The device of claim 7, wherein the gate dielectric layer and the third metal layer form a top transistor with a top surface portion of the semiconductor fin, the gate dielectric layer and the first sidewall portion of the first metal layer form a sidewall transistor with a sidewall portion of the semiconductor fin, and wherein the top transistor has a first threshold voltage, and the sidewall transistor has a second threshold voltage different from the first threshold voltage.

13. The device of claim 7, wherein the third metal layer does not extend on sidewalls of the first sidewall portion of the first metal layer.

14. The device of claim 7, wherein the ILD has a top surface coplanar with a top surface of the second metal layer.

15. A device comprising:
    a substrate;
    a semiconductor fin over the substrate; and
    a transistor comprising:
        a gate dielectric comprising a top portion overlapping the semiconductor fin, and a sidewall of the semiconductor fin; and
        a gate electrode over the gate dielectric, wherein the gate electrode comprises:

a first metal layer comprising a first top portion overlapping and contacting the top portion of the gate dielectric;
   a second metal layer comprising a second top portion overlapping and contacting the first top portion, and a first sidewall portion on a sidewall of, and contacting, the sidewall portion of the gate dielectric, and the first metal layer and the second metal layer comprise different materials; and
 a third metal layer comprising a third top portion overlapping and contacting the second top portion, and a second sidewall portion on a sidewall of, and contacting the first sidewall portion of the second metal layer.

16. The device of claim 15, wherein the gate dielectric comprises a high-k dielectric material, and the device further comprises a silicon oxide layer underlying the gate dielectric.

17. The device of claim 15, further comprising a capping layer over the gate dielectric and under the first top portion of the first metal layer.

18. The device of claim 17, wherein the capping layer comprises titanium nitride or tantalum nitride.

19. The device of claim 15, wherein the first metal layer and the second metal layer have different work functions.

20. The device of claim 15, wherein a first work function of the first metal layer is different from a second work function of the second metal layer.

21. The device of claim 19, wherein a difference between the first work function and the second work function is between about 0.1 eV and about 1.0 eV.

\* \* \* \* \*